United States Patent [19]

De Givry

[11] Patent Number: 5,562,837
[45] Date of Patent: Oct. 8, 1996

[54] METHOD FOR CONNECTING ELECTRONIC CIRCUITS IN A MULTI-CHIP MODULE HAVING A CO-FIRED SUBSTRATE AND MULTI-CHIP MODULE OBTAINED THEREBY

[75] Inventor: Jacques De Givry, Les Loges en Josas, France

[73] Assignee: Matra Marconi Space France, Paris, France

[21] Appl. No.: 385,720

[22] Filed: Feb. 8, 1995

[30] Foreign Application Priority Data

Feb. 10, 1994 [FR] France ................................. 94 01511

[51] Int. Cl.$^6$ ........................................................ B44C 1/22
[52] U.S. Cl. ................................................. 216/18; 216/20
[58] Field of Search ................................. 216/13, 17, 18,
216/20, 33, 56, 39; 156/89; 428/210, 209, 901

[56] References Cited

U.S. PATENT DOCUMENTS 5,176,772  1/1993  Ohtaki ......................................... 156/89
5,378,313  1/1995  Pace ....................................... 216/18 X

FOREIGN PATENT DOCUMENTS 0016306  10/1980  European Pat. Off. .
0331161  9/1989  European Pat. Off. .
0535711  4/1993  European Pat. Off. .

OTHER PUBLICATIONS

3rd IEEE/CHMT IEMTS, Oct. 12–14, 1987, Anaheim, CA, USA "A Composite Multilayer Ceramic Substrate for High-Performance Multi-Chip Packages"–A. Doya et al–pp. 102–108.

IEEE Transactions on Components, Hybrids, and Manufacturing Technology, vol. 12, N°4, Dec. 1989, New York, USA "A New Multichip Module Using a Copper Polyimide Multilayer Substrate"–Sasaki et al–pp. 658–662.

IBM Technical Disclosure Bulletin, vol. 21, N°10, Mar. 1979, New York, USA "Hermetic Hybrid Module"–Martin et al–pp. 4023–4024.

*Primary Examiner*—William Powell
*Attorney, Agent, or Firm*—Larson and Taylor

[57] ABSTRACT

The multi-chip module comprises a co-fired substrate, and, on at least ont face of the substrate, a set of superimposed ceramic insulating layers, fired at a temperature substantially smaller than the firing temperature of the substrate. Conducting interconnection lines are formed in thick layers deposited between said ceramic insulating layers. Electronic components are mounted at the surface of the set of ceramic layers.

8 Claims, 2 Drawing Sheets

METHOD FOR CONNECTING ELECTRONIC CIRCUITS IN A MULTI-CHIP MODULE HAVING A CO-FIRED SUBSTRATE AND MULTI-CHIP MODULE OBTAINED THEREBY

BACKGROUND OF THE INVENTION

The present invention relates to the field of assemblies of microelectronic components, and more particularly to multi-chip modules having a high temperature co-fired substrate.

The co-fired substrates are obtained by stacking under pressure insulating layers (generally alumina-based) and conducting layers (generally tungsten-based), and then by firing the whole stack at high temperature (typically 1500° C.). Such substrates are often used to manufacture multi-chip modules. In such application, the co-fired substrates have the following advantages:

the module is readily sealed by means of metallic covers, without requiring weak connections by means of glass bead or the like, since the signals can be exchanged via the edges of the substrate;

a co-fired substrate can readily receive circuits on both faces thereof with interconnections through via holes provided in the substrate;

the heat evolved by the microcircuits is well evacuated towards the edges of the substrate whose different layers act as thermal drains.

A disadvantage of the co-fired substrate multi-chip modules is that they are limited regarding the grouping density and the interconnection density of the microcircuits. They are not suitable when high speed signals are to be exchanged between the circuits, because of the resistivity of tungsten and of the relatively high capacity between the conducting layers. Moreover, the accuracy of the conducting regions provided at the substrate surface for connecting the circuits is not very high, since the important thermal shrinkages that occur when the substrate is fired at high temperature cannot be precisely monitored.

In order to increase the circuit connection density in a multi-chip module having a co-fired substrate, it has been proposed to form thin lines layers on the substrate, with organic dielectric layers (polyimide or derived products) interposed therebetween. Disadvantages of such solution are the unreliability of the connection wire bondings, the humidity outgasing of the organic products employed, and the fact that such organic products do not have a good temperature behaviour, so that it is very difficult to seal the module by bonding a cover on the substrate (the conventional Kovar covers are bonded at a temperature higher than 300° C.).

In the article "A composite multi-layer ceramic substrate for high performance multi-chip packages" (Third IEEE/CHMT IEMTS, Oct. 12–14, 1987, Anaheim, Calif., USA, pages 102–108), A. Dohya et al disclose a multi-chip module having a co-fired substrate which is not a high temperature co-fired substrate, but a glass-ceramic substrate which is sintered at about 900° C. A fine multi-layer wiring part is formed on the multi-layer substrate by alternately fabricating a conducting layer and an insulating layer. The conducting layer is obtained by an electrodeposition technique and fired at 850° C. The insulation layer is made from a photosensitive dielectric paste which is fired at 850° C. The use of photosensitive dielectric pastes is not without disadvatages, and limits the interconnection density. In addition, the low temperature difference between the firing temperatures of the substrate and of the additional layers severely limits the performances of the module. The diffusion of the inks into the substrate, which is not negligible, requires a relatively high separation between the conducting lines, and thus limits the interconnection density.

An object of the present invention is to propose another technique for increasing the connection densities in a multi-chip module having a co-fired substrate, that better meets the requirements of practice.

SUMMARY OF THE INVENTION

The invention proposes a method for connecting electronic circuits in a multi-chip module having a co-fired substrate, comprising depositing, on at least one face of the substrate, a stack of ceramic insulating layers and conducting layers, the layers of the stack being fired separately at a temperature substantially smaller than the firing temperature of the substrate; and arranging the circuits to be connected at the surface of said stack. The conducting layers of the stack are preferably obtained by screen printing a layer of conducting ink over the whole underlying insulating layer; firing the conducting ink layer; and selectively etching the fired conducting ink layer to form interconnection lines. The difference between the firing temperature of the substrate and the firing temperature of the individual layers of the stack is preferably higher than 450° C.

It is thus possible to increase the connection density in the module, without having the disadvantages of the techniques that make use of organic layers on glass-ceramic substrates.

A co-fired substrate multi-chip module according to the invention comprises, on at least one face of the substrate, a set of superimposed insulating ceramic layers, fired at a temperature substantially smaller than the firing temperature of the substrate, conducting interconnection lines formed in thick layers deposited between said ceramic insulating layers, and electronic components mounted at the surface of the set of ceramic layers.

DESCRIPTION OF A PREFERRED EMBODIMENT

Figure 1:
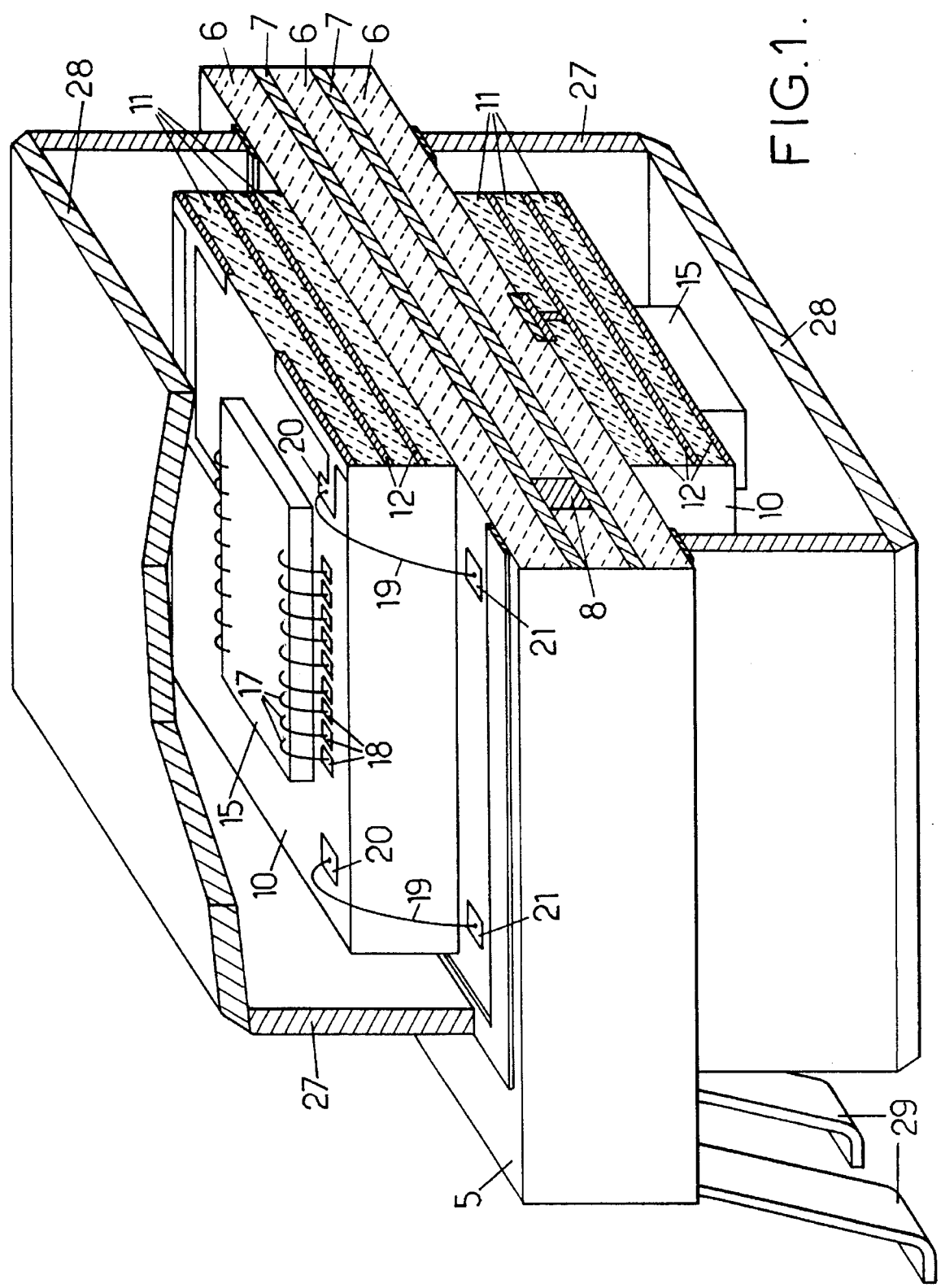
FIG. 1 is a partial sectional perspective view of a multi-chip module according to the invention.
Figure 2:
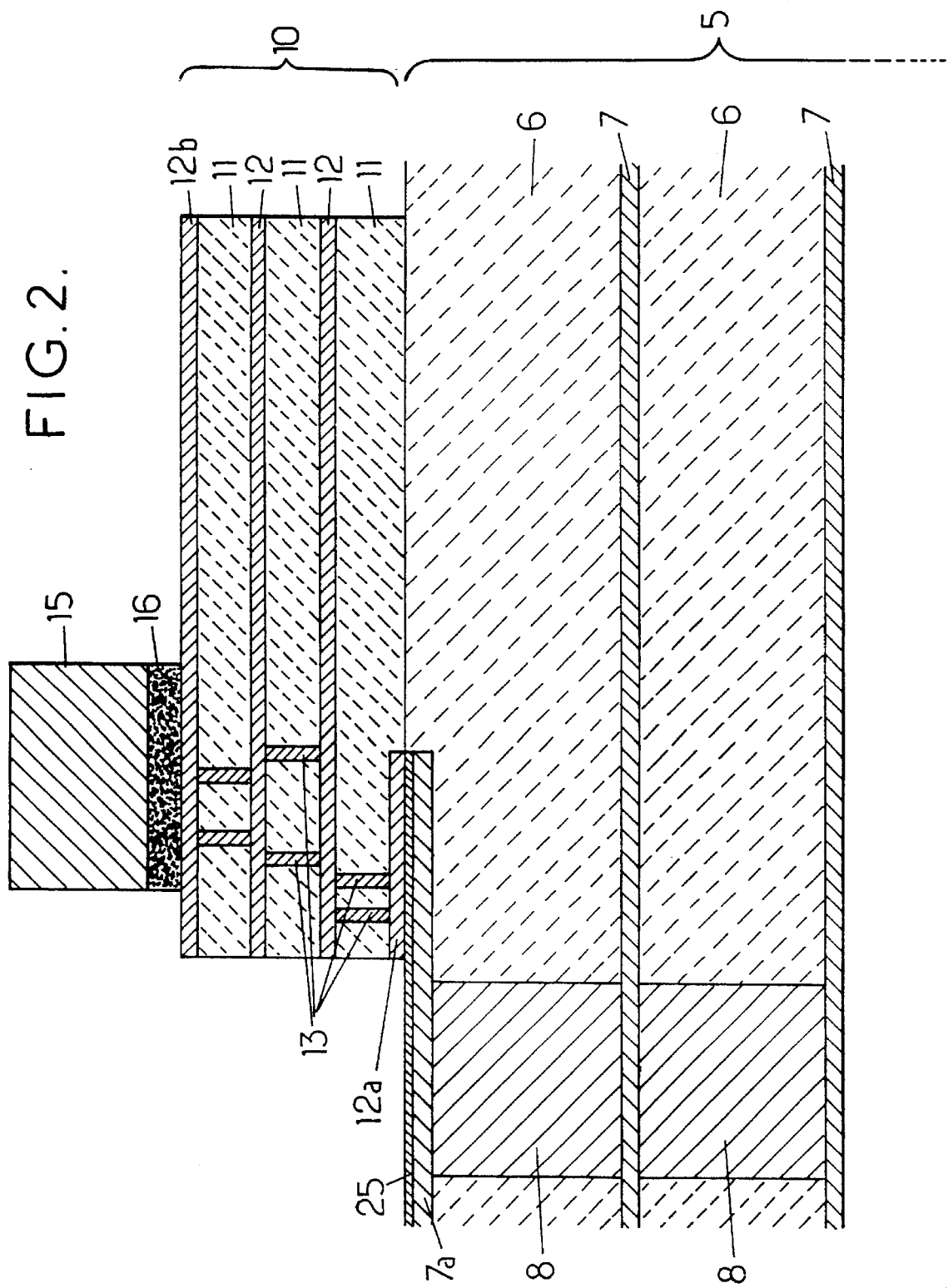
FIG. 2 is a diagrammatic sectional view showing a detail of the module.

The multi-chip modules shown in FIGS. 1 and 2 is made from a high temperature co-fired substrate 5. Substrate 5 consists of superimposed layers that are alternately insulating and conducting. The insulating layers 6 are made of a alumina-based ceramic (alumina from 92 to 99% by weight). The conducting layers 7, 7a are made of tungsten. They include a ground plane, a power plane, and planes consisting of conducting lines for the exchange of signals between the chips of the module and/or with the outside world. Vias 8 made of tungsten are provided at the suitable locations between the conducting layers 7. The layers 6, 7 of the substrate 5 are fired together at high temperature, typically higher than 1450° C., for instance at 1500° C.

Stacks 10 of thick layers that are alternately insulating and conducting are arranged on both faces of the substrate 5. The insulating layers 11 of the stacks 10 are made of a borosilicate-based or aluminosilicate-based ceramic, having a low dielectric constant ($\epsilon=4$ instead of $\epsilon=9.5$ for the co-fired alumina layers). The thickness of the insulating layers is typically between 20 and 40 µm. The conducting layers 12 of the stacks 10 are made from gold or a silver-palladium alloy. Their thickness is typically between 3 and 12 µm. The layers 12 consist of very narrow conducting lines. The width of those lines, as well as their spacing in the plane of the layers 12, is smaller than 50 μm (down to 5 μm), thereby permitting a high signal exchange density within the stacks 10. Vias 13 are provided in the insulating layers 11, and filled with a material similar to the material of the layers 12, for transfering signals between the conducting layers. In addition to the deepest conducting layer 12a which acts as an interface with the substrate 5 and to the outermost conducting layer 12b which acts as an interface with the chips 15, two internal conducting layers 12 consisting of lines parallel to two respective mutually perpendicular directions are generally provided in each stack 10, with the vias 13 providing conduction along the third dimension.

The chips 15 of the module are arranged at the surface of the stacks 10. Those chips (generally made from silicon or gallium arsenide) are fixed by means of an interface layer 16, made of glass-silver, Au—Si or the like. The chip I/O's are connected, by means of wires 17, to metallized regions 18 that belong to the outermost conducting layer 12b of the stack 10. Other wire connections 19 can be provided between regions 20 of the outermost conducting layer 12b of the stack 10 and regions 21 of the outermost conducting layer 7a of the substrate 5.

For making a stack 10 on the co-fired substrate 5, the first step is to deposit a thin conducting layer 25 (2 to 8 μm in thickness) of a Au—Co or Au—Ni alloy on the lines of the outermost conducting layer 7a of the substrate 5. The other (insulating) portions of the substrate surface are etched by plasma so as to ensure a good adhesion of the ceramic. The first conducting layer 12a of the stack 10 is then formed by depositing a conducting ink on the portions of the outermost conducting layer 7a of the substrate 5 that will be covered by the stack 10. Such deposition can be made directly by screen printing because of the low accuracy in the resolution of the patterns in layer 7a due to the fabrication process of the co-fired substrate.

The deepest dielectric layer 11 of the stack 10 is then formed, by screen printing a first wet ink layer an the corresponding surface, by drying the first layer at 150° C., by screen printing a second wet ink layer (to obtain a good flatness), and by firing the whole dielectric layer 11 at a temperature which is typically between and 850° and 950° C.

The via holes 13 are then formed in the dielectric layer 11. They are individually etched by means of an excimer laser. Such etching mode for the holes enables to obtain with an excellent accuracy via holes having a small diameter (down to 10 μm) with well-defined contours. The conducting material of the vias 13 is then screen printed, directly or through a metallic mask having a typical opening dimension of 25 μm.

The following conducting layer 12 is then formed, with the following sub-steps:

screen printing a conducting ink layer on the whole surface of the underlying insulating layer;

firing this conducting ink at a temperature which is typically between 850° C. and 950° C.; and selectively etching, by photolithography, the fired ink layer so as to leave on the substrate only the required metallic patterns.

Such deposition/selective etching technique enables to realize the conducting patterns with a high accuracy.

The procedure is repeated for the following insulating layers 11 and conducting layers 12 until the stack is finished.

The chips 15 are then arranged on the stack 10, and their connection wires 17 are bonded.

The high temperature difference (more than 450° C.) between the firing temperatures of the substrate and of the individual layers of the stacks 10 prevents the thick layer ink materials from migrating into the substrate, and thus enables a high interconnection density.

In order to seal the module, metallic frames 27 (made of the Fe—Ni—Co alloy called Kovar) are brazed by means of an alloy such as AuSn, AuGe or the like on the metallized substrate 5 around the thick layer stacks 10, and metallic covers 28 (made of Kovar of Nickel) are soldered or brazed on the frames 27.

In order to provide for the connections of the module with the mother-board on which it is intended to be mounted, conducting pins in the form of Kovar strips 29 are brazed at high temperature on peripheral conducting regions of the substrate 5. Those pins 29 will subsequently be soldered on the mother-board.

When the substrate 5 has stacks 10 and chips 15 only on one of its faces, connection between the module and the mother-board can, alternatively, be made by means of tinned regions provided on the other face of the substrate.

For applications of the module where sealing is not required, the Kovar frame and the cover can be dispensed with, and the stack 10 and the chips 15 can be coated by a protecting gel and, optionally, covered by a plastic cover.

I claim:

1. A method for connecting electronic circuits in a multi-chip module, comprising the steps of:

providing a high temperature co-fired substrate;

forming on at least one face of the substrate a stack of ceramic insulating layers and conducting layers, the layers of the stack being fired separately at a temperature substantially smaller than the firing temperature of the substrate; and arranging circuits to be connected at the surface of said stack, wherein each conducting layer of the stack is obtained by the following steps;

screen printing a layer of conducting ink on the whole underlying insulating layer;

firing the conducting ink layer; and selectively etching the fired conducting ink layer to form interconnection lines.

2. A method according to claim 1, wherein the firing temperature of the individual layers of the stack is at least 450° C. lower than the firing temperature of the substrate.

3. A method according to claim 1, wherein via holes are formed in each insulating layer of the stack by means of an excimer laser.

4. A method according to claim 1 comprising arranging stacks of ceramic insulating layers and conducting layers on both faces of the co-fired substrate.

5. A method according to claim 1 further comprising the steps of: brazing a metallic frame on the co-fired substrate around the stack of ceramic insulating layers and conducting lines; and soldering or brazing a metallic cover on said frame to seal the module.

6. A method according to claim 1 comprising coating the stack of ceramic insulating layers and conducting lines by a protecting gel.

7. A method according to claim 1 wherein the width of the conducting interconnection lines is between 5 and 50 μm.

8. A method according to claim 1 wherein the thickness of the conducting interconnection lines is between 3 and 12 μm.

* * * * *